United States Patent
Chen et al.

(10) Patent No.: US 10,638,235 B2
(45) Date of Patent: Apr. 28, 2020

(54) MEMS SPEAKER

(71) Applicant: Merry Electronics(Shenzhen) Co., Ltd., ShenZhen (CN)

(72) Inventors: Jen-Yi Chen, Taichung (TW); Chao-Sen Chang, Taichung (TW); Kai-Yu Jiang, Taichung (TW)

(73) Assignee: Merry Electronics (Shenzhen) Co., Ltd., ShenZhen (CN)

( * ) Notice: Subject to any disclaimer, the term of this patent is extended or adjusted under 35 U.S.C. 154(b) by 0 days.

(21) Appl. No.: 16/162,397

(22) Filed: Oct. 17, 2018

(65) Prior Publication Data
US 2020/0059734 A1 Feb. 20, 2020

(30) Foreign Application Priority Data
Aug. 14, 2018 (TW) ............... 107128366 A

(51) Int. Cl.
| | |
|---|---|
| H04R 25/00 | (2006.01) |
| H04R 17/00 | (2006.01) |
| B81B 3/00 | (2006.01) |
| B81B 7/02 | (2006.01) |
| B81B 7/04 | (2006.01) |
| H04R 19/02 | (2006.01) |

(52) U.S. Cl.
CPC ......... *H04R 17/005* (2013.01); *B81B 3/0018* (2013.01); *B81B 7/02* (2013.01); *B81B 7/04* (2013.01); *H04R 19/02* (2013.01); *H04R 2201/003* (2013.01)

(58) Field of Classification Search
CPC .......... H04R 17/005; H04R 19/02; H04R 2201/003; B81B 3/0018; B81B 7/02
USPC ........................................ 381/173
See application file for complete search history.

(56) References Cited

U.S. PATENT DOCUMENTS 6,178,249 B1 * 1/2001 Hietanen ............ H04R 19/005
367/181

* cited by examiner

*Primary Examiner* — Phylesha Dabney
(74) *Attorney, Agent, or Firm* — JCIPRNET

(57) ABSTRACT

A MEMS speaker including a base, a circuit board, a spacing layer, a vibration mold, and at least one actuator. The base has a first chamber. The circuit board is disposed on the base, and has at least one support portion and a fixing portion disposed around the support portion. The at least one support portion has a first perforation, and a plurality of second perforations are formed between the at least one support portion and the fixing portion. The spacing layer is disposed on the circuit board. A second chamber is formed between the spacing layer and the circuit board. The vibration mold is disposed on the spacing layer. The actuator is disposed on the support portion of the circuit board. The actuator has a shift part and a deformation part disposed above the first perforation of the support portion. The second perforations communicate with the first chamber and the second chamber.

17 Claims, 7 Drawing Sheets

MEMS SPEAKER

CROSS-REFERENCE TO RELATED APPLICATION

This application claims the priority benefit of Taiwan application serial no. 107128366, filed on Aug. 14, 2018. The entirety of the above-mentioned patent application is hereby incorporated by reference herein and made a part of this specification.

BACKGROUND

Technical Field

The disclosure relates to a MEMS element, and particularly to a MEMS speaker.

Description of Related Art

Most existing speakers adopt voice coils and magnets. The main principle is to allow a current to produce a magnetic field via the coil, and the excited magnetic field and the magnet interact to produce vibration and make sound. To cope with the miniaturization trend of consumer electronic devices, such as smart phones and tablet PC, piezoelectric speakers manufactured by micro electro-mechanical processes have been developed. The piezoelectric speakers make use of piezoelectric effect to make sound. When external electric field across an actuator, the actuator deforms, thereby driving a vibration membrane to squeeze the air and produce sound.

However, the actuator needs to be fixed in the housing of the speaker. Therefore, the overall size of a piezoelectric speaker is limited by the actuator, causing the production cost of the piezoelectric speaker to be expensive and the target of further miniaturization to be not easily achievable.

SUMMARY

The disclosure provides a micro electro-mechanical system (MEMS) speaker with an actuator disposed on an independent circuit board. Therefore, the size of the actuator is not limited by the circuit board to achieve the targets of reduction in production cost and miniaturization of the MEMS speaker.

The MEMS speaker of the disclosure includes a base, a circuit board, a spacing layer, a vibration mold, and at least one actuator. The base has a first chamber. The circuit board is disposed on the base, and has at least one support portion and a fixing portion sleeved around the at least one support portion. The at least one support portion has a first perforation, and a plurality of second perforations are formed between the at least one support portion and the fixing portion. The spacing layer is disposed on the circuit board, and a second chamber is formed between the spacing layer and the circuit board. The vibration mold is disposed on the spacing layer. The at least one actuator is disposed on the support portion of the circuit board. The at least one actuator has a shift part and a deformation part which are disposed above the first perforation of the at least one support portion. A plurality of second perforations communicate with the first chamber and the second chamber.

Based on the above, the speaker of the disclosure supports the actuator using the circuit board. Since the actuator and the circuit board are independent structures, the size of the actuator is not limited by the circuit board, thereby achieving the targets of reduction in production cost and miniaturization. In addition, the circuit board has a plurality of second perforations for adjusting the air pressure balance between the first chamber and the second chamber to avoid affecting the operation of the actuator and the vibration mold, thereby producing a speaker element with a good frequency response and a high sound production efficiency.

To make the aforementioned and other features of the disclosure more comprehensible, several embodiments accompanied with drawings are described in detail as follows.

DETAILED DESCRIPTION OF DISCLOSED EMBODIMENTS

Figure 1A:
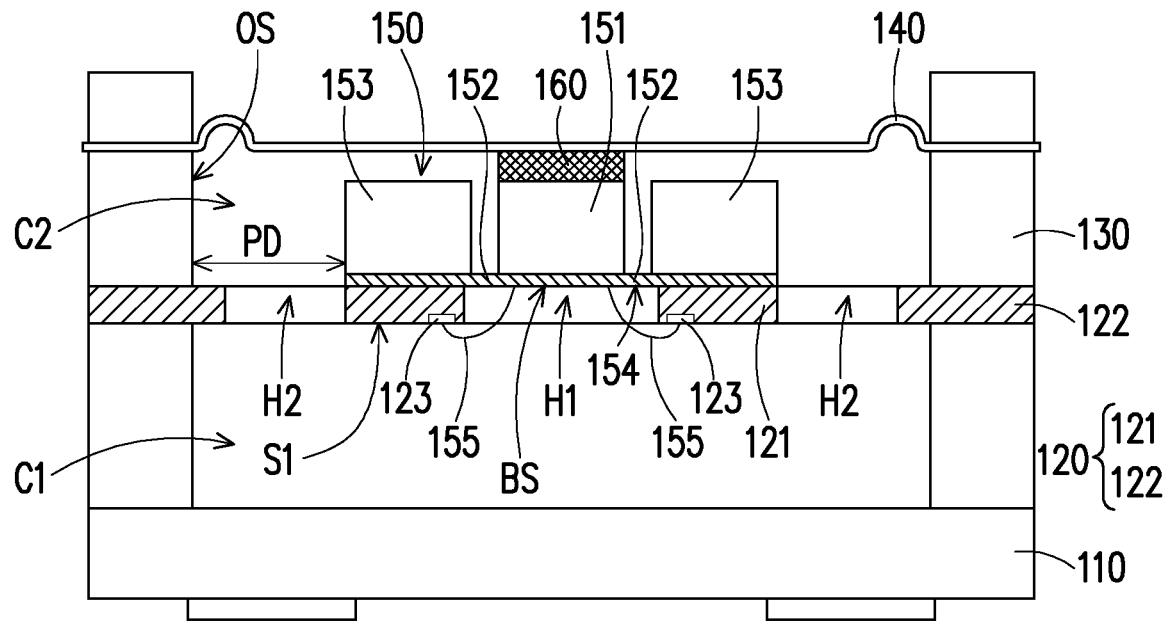
FIG. 1A is a schematic cross-sectional view of a MEMS speaker according to an embodiment of the disclosure.

FIG. 1A is a schematic cross-sectional view of a MEMS speaker according to an embodiment of the disclosure.

Please refer to FIG. 1A. A MEMS speaker 100 is adapted to be disposed in an electronic device, such as a cellular phone, a tablet PC, a desktop computer, or other electronic devices. The MEMS speaker 100 of the embodiment adopts, for example, a piezoelectric element. The operation principle is to make sound via piezoelectric effect. In short, an external electric field is applied to the MEMS speaker 100. When electric field is applied across an actuator of the MEMS speaker 100, the actuator is deformed, and shifted up and down, thereby driving a vibration mold to squeeze the air and make sound.

Referring to FIG. 1A, the MEMS speaker of the disclosure includes a base 110, a circuit board 120, a spacing layer 130, a vibration mold 140, and at least one actuator 150. The base 110 adopts, for example, a package substrate material for which the processing technology in the electronic industry is mature, an electronic ceramic, or other materials with rigidity. The base 110 has a recessed first chamber C1, which may be used for other needed electronic elements to be placed in, for example.

The circuit board 120 is disposed on the base 110 and is located above the first chamber C1. The circuit board 120 has a support portion 121 and a fixing portion 122 disposed around the support portion 121. The center of the support portion 121 has a first perforation H1. A plurality of second perforations H2 are provided between the support portion 121 and the fixing portion 122. The plurality of second perforations H2 are disposed around the periphery of the first perforation H1.

In addition, the circuit board 120 of the embodiment is, for example, a printed circuit board or other materials with rigidity. The circuit board 120 includes a conductive circuit 123 disposed on an upper surface or a lower surface of the support portion 121 or the fixing portion 122. The conductive circuit 123 is, for example, electrically connected to an external circuit to provide power needed for the operation of the MEMS speaker 100 or as a conductive path connecting external circuits.

The spacing layer 130 adopts, for example, polycrystalline silicon, silicon, and silica for which the semiconductor processing technology is mature, or other materials with rigidity. The spacing layer 130 is disposed on the circuit board 120. The spacing layer 130 and the circuit board 120 form a second chamber C2, wherein the plurality of second perforations H2 and the first perforation H1 communicate with the first chamber C1 and the second chamber C2 to adjust the air pressure balance between the first chamber C1 and the second chamber C2.

Furthermore, in the embodiment, the second chamber C2 and the first chamber C1 are, for example, a chamber space surrounded by a printed circuit board stack, a semiconductor material layer, or other materials with rigidity. Using the design of stacking a plurality of chambers, and the chamber space is expanded.

The vibration mold 140 is disposed on the spacing layer 130 and covers the second chamber C2. In the embodiment, the vibration mold 140 is made of, for example, polycrystalline silicon, silicon nitride, metal-alumina or aluminum alloy material, polymer, or other elastic materials.

The at least one actuator 150 (one is shown in FIG. 1A as an example) is disposed on the support portion 121 of the circuit board 120 and is located in the second chamber C2. The actuator 150 has a shift part 151 and a deformation part 152 which are disposed above the first perforation H1 of the support portion 121. In the embodiment, the deformation part 152 is disposed around the shift part 151.

In the embodiment, the actuator 150 has a piezoelectric structure 154 formed on the deformation part 152 of the actuator 150. The piezoelectric structure 154 includes a bottom metal layer, piezoelectric layer and top metal layer. The material of the piezoelectric layer adopts, for example, quartz, cadmium sulfide, zinc oxide or aluminum nitride and other piezoelectric monocrystalline materials, a PZT piezoelectric polycrystalline material, a piezoelectric polymer, a piezoelectric composite material, or other materials with piezoelectric properties. The disclosure is not limited to such. When the external electric field is applied across piezoelectric structure 154 of the actuator 150, the deformation part 152 is deformed due to piezoelectric effect, thereby driving the shift part 151 to produce vibrations up and down.

In addition, the piezoelectric structure 154 further includes an electrode material layer, used to electrically connect the actuator 150 and the external circuit via the circuit board 120.

Please refer to FIG. 1A, there is a parallel distance PD between a periphery E of the actuator 150 and an interior surface OS of the spacing layer 130, meaning that the size of the actuator 150 is smaller than the size of the circuit board 120. As such, the size of the actuator 150 is not limited by the circuit board 120, and a miniaturized actuator may be produced according to needs.

Furthermore, the actuator 150 has a support structure 153. The support structure 153 is disposed around the shift part 151 and is spaced apart from the shift part 151. The deformation part 152 is located between the shift part 151 and the support structure 153. The support structure 153 is used to increase the structural rigidity of the actuator 150 outside the deformation part 152. When the MEMS speaker 100 operates, the portion of the actuator 150 disposed on the support structure 153 is fixed.

The actuator 150 of the embodiment extends toward the direction of the vibration mold 140. The MEMS speaker 100 includes a linkage block 160. The linkage block 160 is disposed between the vibration mold 140 and the actuator 150. Specifically, the linkage block 160 is connected between the shift part 151 of the actuator 150 and the vibration mold 140, so that the actuator 150 is integrated with the vibration mold 140. When the shift part 151 of the actuator 150 shifts up and down, the vibration mold 140 is driven simultaneously.

Furthermore, the actuator 150 of the embodiment further includes at least one wire 155 (FIG. 1A shows two wires). One end of the two wires 155 is connected to the piezoelectric structure 154 of the actuator 150, and the other end of the two wires 155 passes through the corresponding first perforation H1 and is connected to a surface S1 of the circuit board 120 with respect to the actuator 150.

Other embodiments will be exemplified below for illustration. It shall be noted that the following embodiments continue to use the element numerals and parts of disclosure in the aforementioned embodiment, wherein the same numerals are used to denote the same or similar elements, and the description of the same technical content is omitted. The aforementioned embodiment may be taken as reference for the description of the omissions, which will not be reiterated in the following embodiments.

Figure 1B:
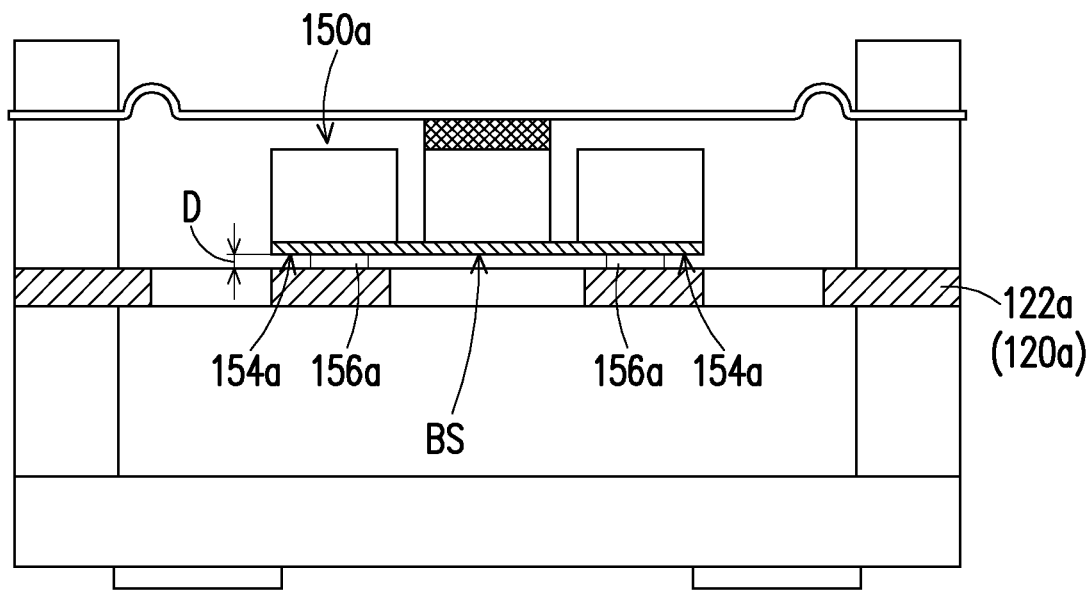
FIG. 1B is a schematic cross-sectional view of the MEMS speaker of FIG. 1A adopting a soldering method.

FIG. 1B is a schematic cross-sectional view of the MEMS speaker of FIG. 1A adopting a soldering method.

Referring to FIG. 1A and FIG. 1B together, the difference between a MEMS speaker 100A of FIG. 1B and the MEMS speaker 100 of FIG. 1A is that the electrical connection methods are different. Referring to FIG. 1B, an actuator 150a includes at least one electrode bump 156a (FIG. 1B shows two electrode bumps). The two electrode bumps 156a are disposed between a circuit board 120a and a bottom surface BS of the actuator 150a, and electrically connected to the piezoelectric structure 154a to form a gap D between the actuator 150a and the circuit board 120a.

Figure 1C:
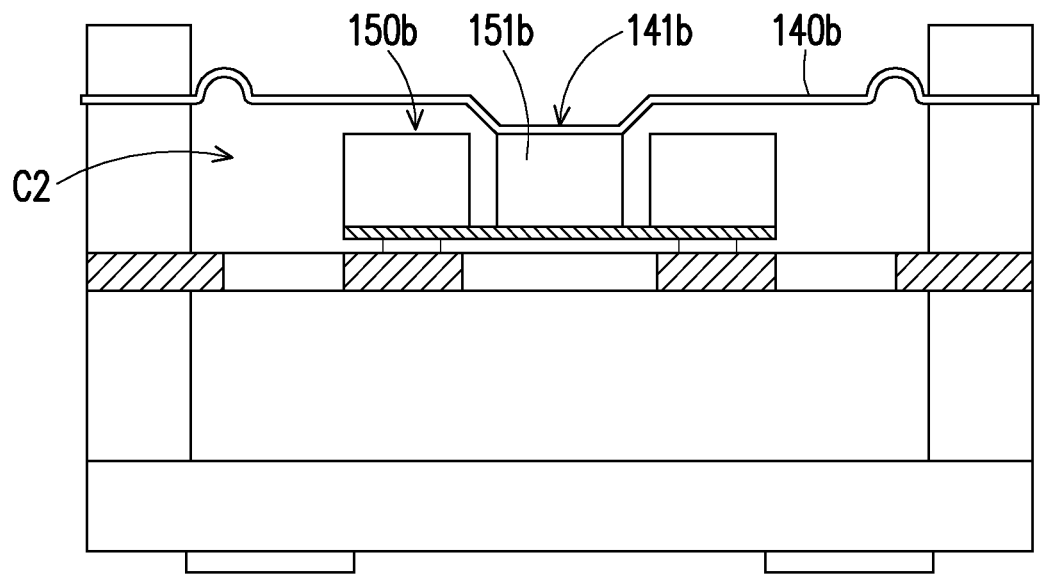
FIG. 1C is a schematic cross-sectional view of the MEMS speaker of FIG. 1B connected to a vibration mold of another embodiment.

FIG. 1C is a schematic cross-sectional view of the MEMS speaker of FIG. 1B connected to a vibration mold of another embodiment.

Referring to FIG. 1B and FIG. 1C together, the difference between a MEMS speaker 100B of FIG. 1C and the MEMS speaker 100A of FIG. 1B is that the MEMS speaker 100B has a vibration mold 140b and does not need to be configured with a linkage block. The vibration mold 140b has a recession part 141b aligned with the first perforation H1, and the recession part 141b extends toward the second chamber C2. The vibration mold 140b is connected to a shift part 151b of an actuator 150b via the recession part 141b. Therefore, the shift part 151b of the actuator 150b can directly drive the vibration mode 140b without any additional linkage block.

Figure 1D:
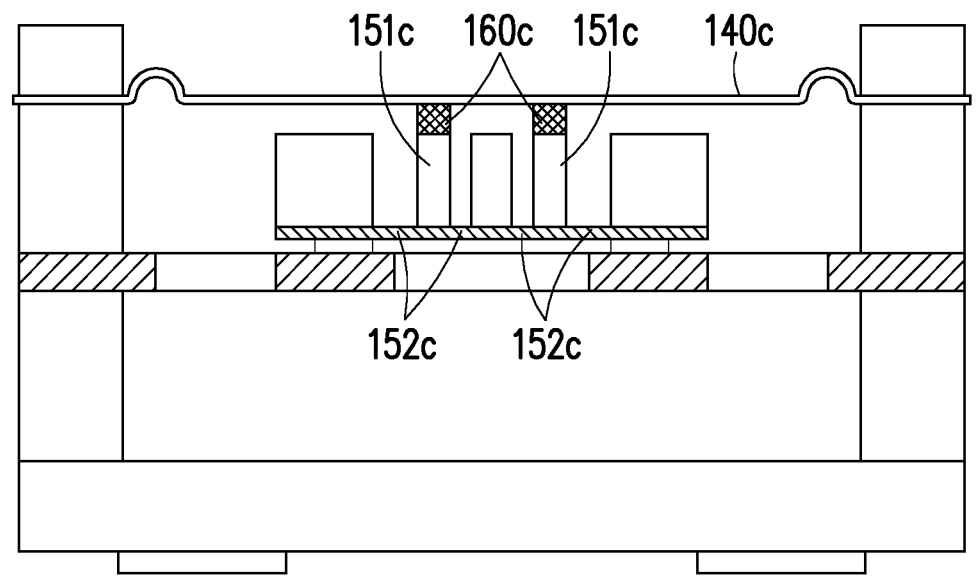
FIG. 1D is a schematic cross-sectional view of a MEMS speaker configured with a plurality of shift parts according to another embodiment of the disclosure.

FIG. 1D is a cross-sectional schematic view of a MEMS speaker in FIG. 1B configured with a plurality of shift parts according to another embodiment of the disclosure.

Referring to FIG. 1B and FIG. 1D together, the difference between a MEMS speaker 100C of FIG. 1D and the MEMS speaker 100A of FIG. 1B is that the MEMS speaker 100C includes a shift part 151c, a linkage block 160c, and a deformation part 152c. The linkage block 160c is disposed on the shift part 151c, the deformation part 152c is respectively disposed at the periphery of the shift part 151c. The shift part 151c is connected to a vibration mold 140c via the linkage block 160c to drive the vibration mold 140c simultaneously or individually. As such, when external air pressure or other factors cause the vibration frequency and the amplitude of the vibration mold 140c to deviate, the deviation may be adjusted via the frequency and the vibrational amplitude of the shift part 151c.

Figure 2:
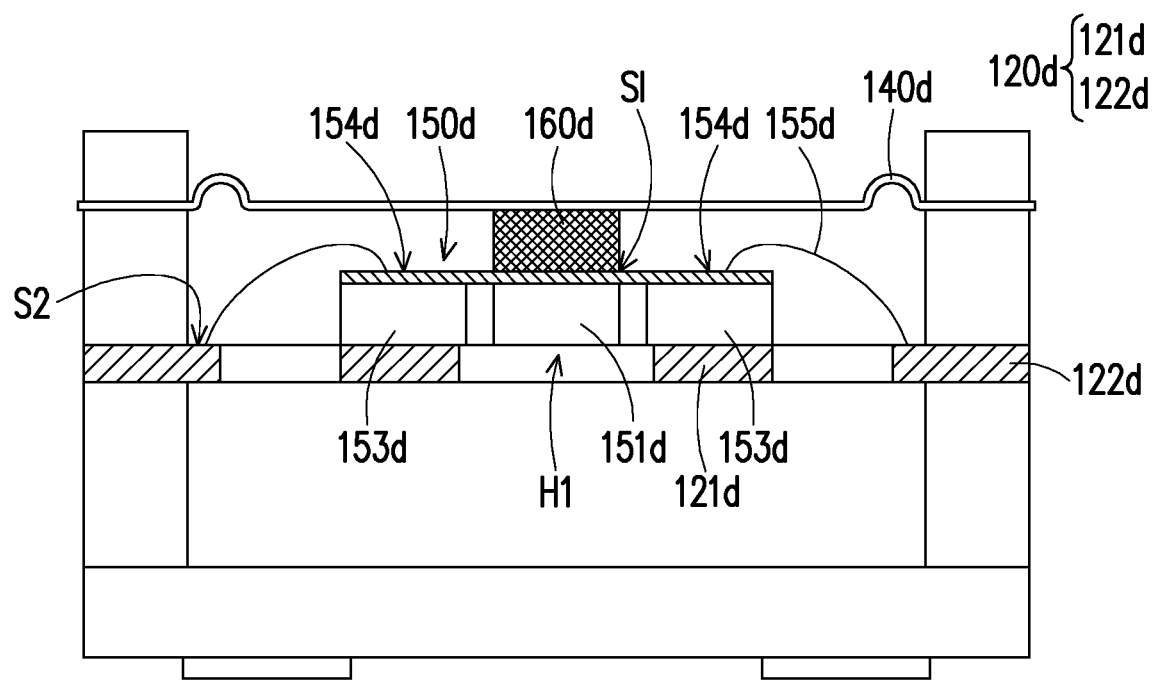
FIG. 2 is a schematic cross-sectional view of a MEMS speaker according to yet another embodiment of the disclosure.

FIG. 2 is a schematic cross-sectional view of a MEMS speaker according to another embodiment of the disclosure.

Referring to FIG. 1A and FIG. 2 together. The difference between a MEMS speaker 100D of FIG. 2 and the MEMS speaker 100 of FIG. 1A is that the setting direction of an actuator 150d of the MEMS speaker 100D on a circuit board 120d is opposite to the setting direction of the actuator 150 on the circuit board 120. A support structure 153d of the actuator 150d is connected to support portion 121d of the circuit board 120d such that a shift part 151d extends downward toward the first perforation H1. Furthermore, a linkage block 160d is disposed on a side surface SI of the shift part 151d with respect to the support structure 153d, thereby connecting the shift part 151d with the vibration mold 140d as a whole. Furthermore, one end of each of the two wires 155d is connected to a piezoelectric structure 154d of the actuator 150d, and the other end of each of the two wires 155d is connected to a surface S2 of the circuit board 120d facing the vibration mold 140d.

Figure 3:
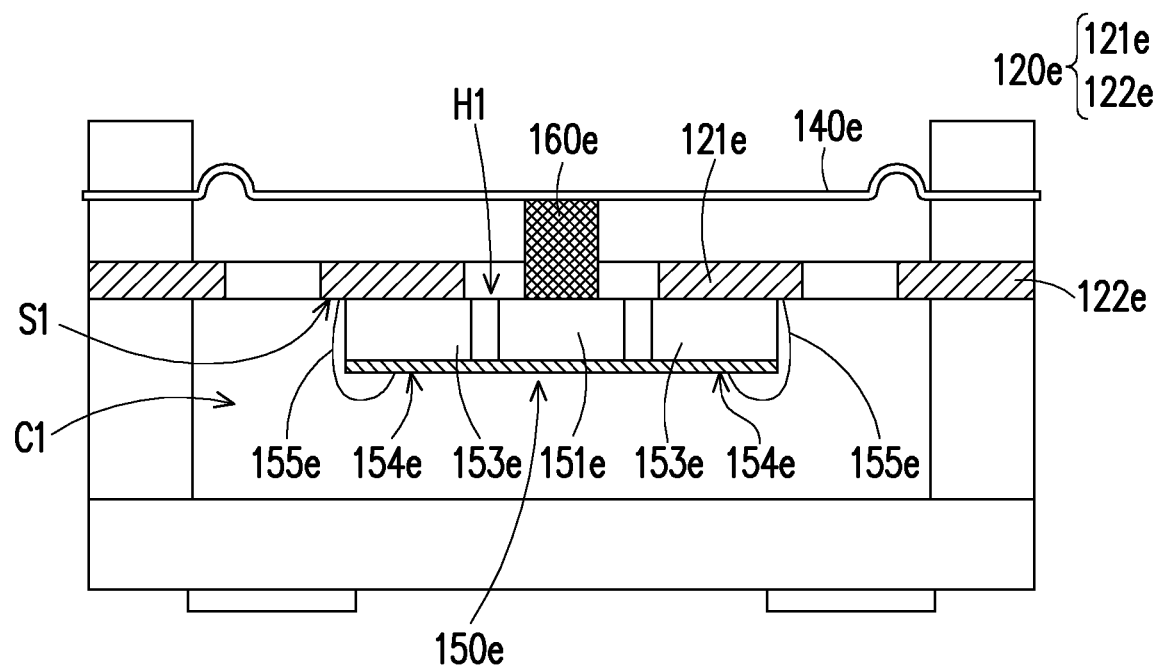
FIG. 3 is a schematic cross-sectional view of a MEMS speaker according to still another embodiment of the disclosure.

FIG. 3 is a schematic cross-sectional view of a MEMS speaker according to another embodiment of the disclosure.

Referring to FIG. 1A and FIG. 3 together. The difference between a MEMS speaker 100E of FIG. 3 and the MEMS speaker 100 of FIG. 1A is that an actuator 150e of the MEMS speaker 100E is located in the first chamber C1, and a support structure 153e of the actuator 150e is connected to a support portion 121e of a circuit board 120e such that a shift part 151e extends upward toward the first perforation H1. Furthermore, a linkage block 160e is disposed on a side of the shift part 151e facing a vibration mold 140e. The linkage block 160e passes through the first perforation H1 upward to connect to the vibration mold 140e, thereby connecting the shift part 151e and the vibration mold 140e as a whole. In addition, one end of each of two wires 155e is connected to a piezoelectric structure 154e of the actuator 150e, and the other end of each of the two wires 155e is connected to the surface S1 of the circuit board 120e away from the vibration mold 140e.

Figure 4:
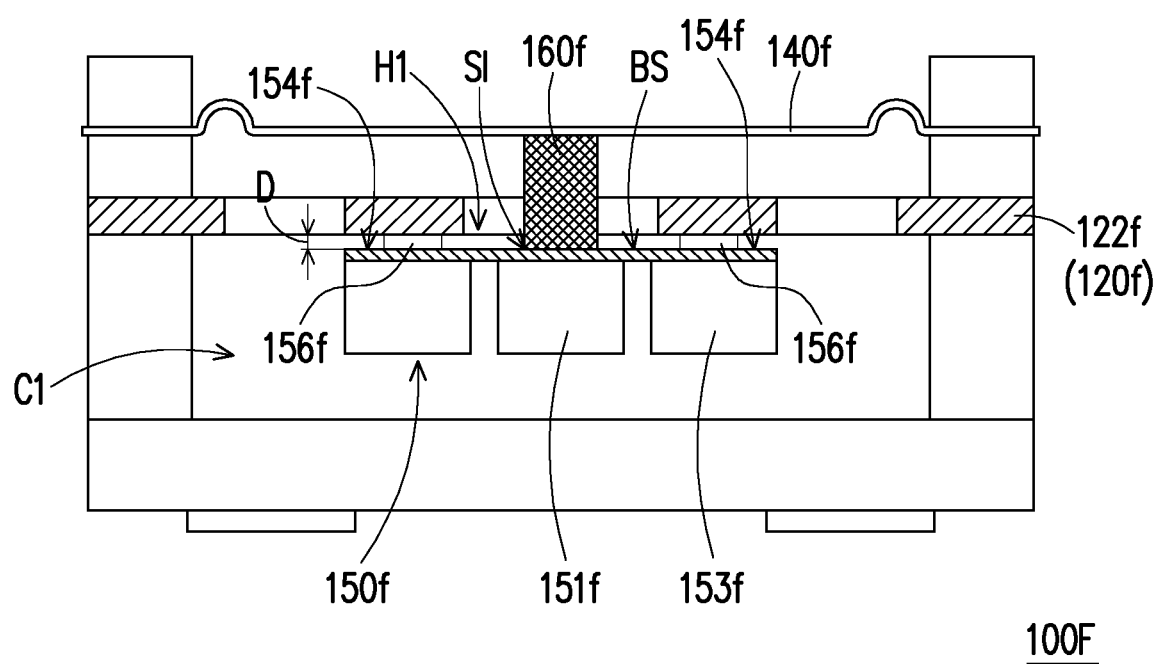
FIG. 4 is a schematic cross-sectional view of a MEMS speaker according to yet another embodiment of the disclosure.

FIG. 4 is a schematic cross-sectional view of a MEMS speaker according to another embodiment of the disclosure.

Referring to FIG. 2 and FIG. 4 together. The difference between a MEMS speaker 100F of FIG. 4 and the MEMS speaker 100D of FIG. 2 is that an actuator 150f of the MEMS speaker 100F is located in the first chamber C 1, and two electrode bumps 156f are disposed between a circuit board 120f and the bottom surface BS of the actuator 150f to respectively and electrically connect to the piezoelectric structure 154f such that a gap D is formed between the actuator 150f and the circuit board 120f. Furthermore, a linkage block 160f is disposed on a side surface SI of a shift part 151f with respect to a support structures 153f. The linkage block 160f passes through the first perforation H1 upward to connect to a vibration mold 140f, thereby connecting the shift part 151f and the vibration mold 140f as a whole.

Figure 5A:
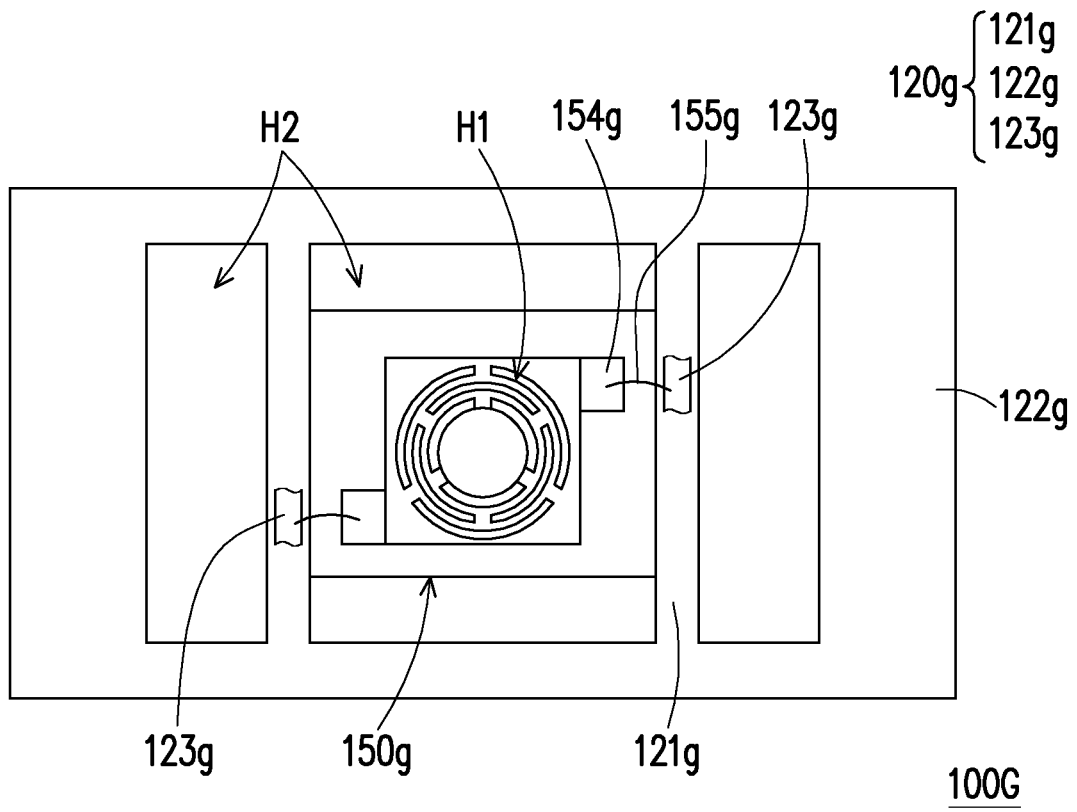
FIG. 5A is a schematic top view of a MEMS speaker according to another embodiment of the disclosure.
Figure 5B:
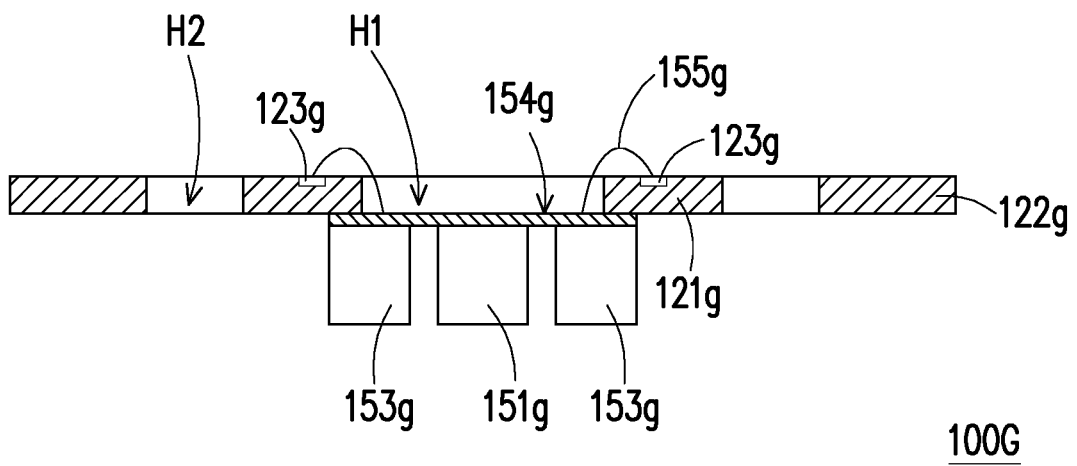
FIG. 5B is a schematic cross-sectional view of the actuator of FIG. 5A.
Figure 5C:
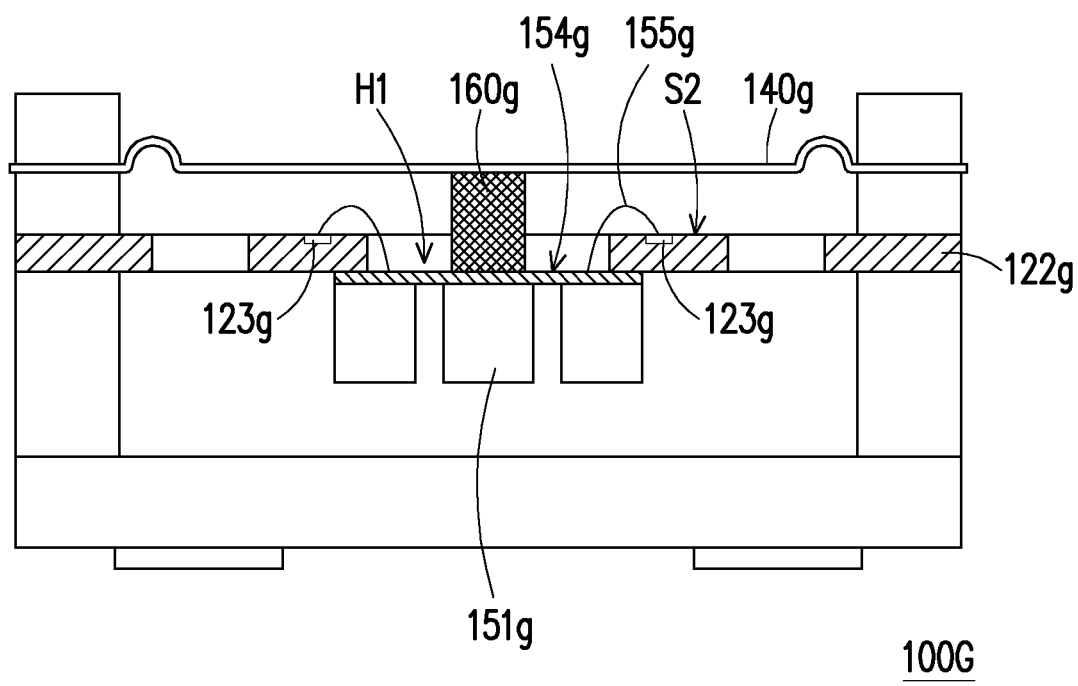
FIG. 5C is a schematic cross-sectional view of the actuator of FIG. 5B connected to a linkage block.

FIG. 5A is a schematic top view of a MEMS speaker according to another embodiment of the disclosure. FIG. 5B is a cross-sectional schematic view of the actuator of FIG. 5A. FIG. 5C is a cross-sectional schematic view of the actuator of FIG. 5B connected to a linkage block.

Referring to FIGS. 2 and 5A to 5C together. The difference between a MEMS speaker 100G of FIG. 5A and the MEMS speaker 100D of FIG. 2 is that an actuator 150g of the MEMS speaker 100G is located in the first chamber C1. Referring to FIGS. 5B and 5C, one end of each of the two wires 155g is connected to a piezoelectric structure 154g of the actuator 150g, and the other end of each of the two wires 155g passes through the corresponding first perforation H1 to connect to the surface S2 of a support portion 121g on a circuit board 120g facing a vibration mold 140g. A linkage block 160g is disposed on a side of a shift part 151g facing the vibration mold 140g. The linkage block 160g passes through the first perforation H1 upward to connect to the vibration mold 140g, thereby connecting the shift part 151g and the vibration mold 140g as a whole.

Figure 6:
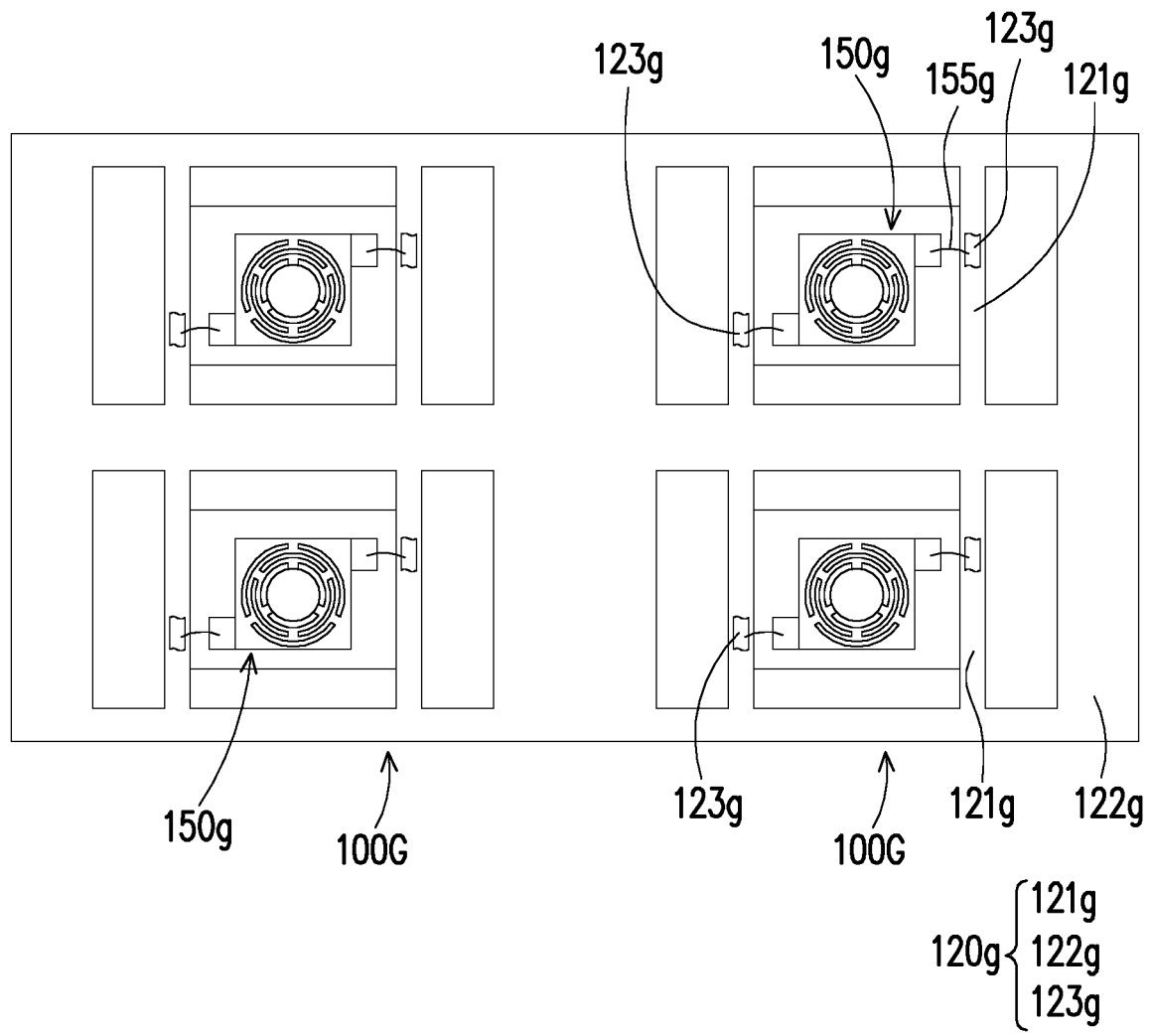
FIG. 6 is a schematic top view showing combination of a plurality of MEMS speakers of FIG. 5A.

FIG. 6 is a schematic top view showing combination of a plurality of MEMS speakers of FIG. 5A.

In the embodiment of FIG. 6, the support portion 121g on the circuit board 120g may be designed to be multiples. The user may place a plurality of actuators 150g on the corresponding a plurality of support portions 121g according to actual needs, and by matching with a plurality of sets of independent conductive circuits 123g, each MEMS speaker 100G can make sound of a different bandwidth. A plurality of actuators 150g are arranged in an array.

Specifically, the circuit board 120g includes a plurality of support portions 121g and a plurality of sets of conductive circuits 123g. The plurality of actuators 150g are respectively disposed on the plurality of corresponding support portions 121g. The plurality of sets of conductive circuits are respectively disposed on the corresponding support portions 121g, and each set of the conductive circuits 123 is electrically independent. The plurality of sets of conductive circuits 123g are electrically connected to the plurality of corresponding actuators 150g via a plurality of wires 115 respectively.

FIG. 6 is an array combination of four MEMS speakers 100G. In short, by combining a plurality of MEMS speakers 100G, the a plurality of MEMS speakers 100G may be operated simultaneously to make sound of high power, or the actuators 150g of various MEMS speakers 100G respectively produce vibrations of different frequencies to achieve the effect of making sound with different bandwidths, thereby enriching the sound.

Based on the above, the speaker of the disclosure supports the actuator using the circuit board. Since the actuator and the circuit board are independent structures, the size of the actuator is not limited by the circuit board, thereby achieving the targets of reduction in production cost and miniaturization. In addition, the circuit board has a plurality of second perforations disposed around the actuator for adjusting the air pressure balance between the first chamber and the second chamber to avoid affecting the operation of the actuator and the vibration mold, so as to produce a speaker element with a good frequency response and a high sound production efficiency.

Furthermore, the circuit board is used to support the actuator, and the actuator is attached to the circuit board and is electrically connected to the circuit board via wires, wherein the wires passes through the first perforation such that the wires do not interfere with other components.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A MEMS speaker, comprising:
    a base, having a first chamber;
    a circuit board, disposed on the base, having at least one support portion, a fixing portion disposed around the at least one support portion, the at least one support portion having a first perforation, a plurality of second perforations disposed between the at least one support portion and the fixing portion;
    a spacing layer, disposed on the circuit board, forming a second chamber with the circuit board;
    a vibration mold, disposed on the spacing layer; and
    at least one actuator, disposed on the at least one support portion of the circuit board, having a shift part and a deformation part above the first perforation of the at least one support portion;
    wherein the plurality of second perforations communicates with the first chamber and the second chamber.

2. The MEMS speaker according to claim 1, wherein a parallel distance is formed between the at least one actuator and the spacing layer.

3. The MEMS speaker according to claim 1, wherein the at least one actuator has a support structure disposed around a periphery of the shift part and spaced apart from the shift part.

4. The MEMS speaker according to claim 3, wherein the deformation part is located between the shift part and the support structure.

5. The MEMS speaker according to claim 1, wherein the actuator has a piezoelectric structure, disposed on the deformation part, and the piezoelectric structure at least comprising a piezoelectric layer and an electrode material layer.

6. The MEMS speaker according to claim 1, wherein a linkage block is further provided between the vibration mold and the actuator.

7. The MEMS speaker according to claim 6, wherein the linkage block is disposed on a side surface of the shift part facing the vibration mold.

8. The MEMS speaker according to claim 6, wherein the actuator is located in the first chamber, and the linkage block passes through the first perforation to connect to the vibration mold.

9. The MEMS speaker according to claim 1, wherein the actuator further comprises at least one wire passing through the first perforation and connected to a surface of the circuit board with respect to the actuator.

10. The MEMS speaker according to claim 1, wherein the actuator further comprises at least one electrode bump disposed between the circuit board and the actuator to form a gap between the actuator and the circuit board.

11. The MEMS speaker according to claim 1, wherein the shift part is connected to the vibration mold to drive the vibration mold simultaneously or individually.

12. The MEMS speaker according to claim 1, wherein the vibration mold has a recession part aligned with the first perforation, and the vibration mold connects to the shift part of the actuator via the recession part.

13. The MEMS speaker according to claim 1, wherein the circuit board is a printed circuit board.

14. The MEMS speaker according to claim 1, wherein the circuit board comprises a plurality sets of conductive circuits electrically independent from one another.

15. The MEMS speaker according to claim 14, wherein the number of the at least one actuator includes a plurality of actuators, and the conductive circuits are respectively connected to the corresponding actuators.

16. The MEMS speaker according to claim 1, wherein the number of the at least one actuator includes a plurality of actuators, and the circuit board comprises a plurality of support portions, the actuators are respectively disposed on the corresponding support portions.

17. The MEMS speaker according to claim 16, wherein the actuators are arranged in an array.

* * * * *